(12) United States Patent
Zhang et al.

(10) Patent No.: US 9,601,212 B2
(45) Date of Patent: Mar. 21, 2017

(54) STORAGE DEVICE AND INFORMATION PROCESSING METHOD

(71) Applicants: BEIJING LENOVO SOFTWARE LTD., Beijing (CN); LENOVO (BEIJING) LIMITED, Beijing (CN)

(72) Inventors: Honglei Zhang, Beijing (CN); Xiaohui Xie, Beijing (CN); Zhigang Li, Beijing (CN)

(73) Assignees: BEIJING LENOVO SOFTWARE LTD., Beijing (CN); LENOVO (BEIJING) LIMITED, Beijing (CN)

( * ) Notice: Subject to any disclaimer, the term of this patent is extended or adjusted under 35 U.S.C. 154(b) by 0 days.

(21) Appl. No.: 14/848,710

(22) Filed: Sep. 9, 2015

(65) Prior Publication Data
US 2017/0032845 A1 Feb. 2, 2017

(30) Foreign Application Priority Data
Jul. 27, 2015 (CN) .......................... 2015 1 0446339

(51) Int. Cl.
G11C 16/10 (2006.01)
G11C 16/30 (2006.01)
G11C 16/14 (2006.01)

(52) U.S. Cl.
CPC .............. *G11C 16/30* (2013.01); *G11C 16/14* (2013.01)

(58) Field of Classification Search
USPC ..................................... 365/185.18
See application file for complete search history.

(56) References Cited

U.S. PATENT DOCUMENTS

| 8,456,910 B2 * | 6/2013 | Lukashevich | G11C 16/0433 257/371 |
| 2006/0171186 A1 * | 8/2006 | Yamaoka | G11C 11/22 365/145 |

* cited by examiner

*Primary Examiner* — Hoai V Ho
*Assistant Examiner* — Minh Dinh
(74) *Attorney, Agent, or Firm* — Scully Scott Murphy & Presser

(57) ABSTRACT

A storage device and an information processing method are provided. The storage device has a first power supply unit and at least one first storage cell. The at least one first storage cell stores first data which are associated with a number of charges within the first storage cell. The first power supply unit is electrically connected to the at least one first storage cell. The storage device further has a first control unit configured for controlling the first power supply unit to supply power to the at least one first storage cell according to a predetermined policy, so that the number of charges within the first storage cell satisfies a first preset condition.

10 Claims, 6 Drawing Sheets

101: Control The First Power Supply Unit To Supply Power To The At Least One First Storage Cell According To A Predetermined Policy, So That A Number Of Charges Within The First Storage Cell Satisfies A First Preset Condition

Fig. 1

201 : Determine Whether The Voltage Corresponding To The Charges In The First Storage Cell Is Lower Than A First Threshold

202 : When The Voltage Corresponding To The Charges In The First Storage Cell Is Lower Than The First Threshold, Control The First Power Supply Unit To Supply Power To The First Storage Cell, So That The Voltage Corresponding To The Charges Representing The First Data Is Higher Than The First Threshold

Fig. 2

STORAGE DEVICE AND INFORMATION PROCESSING METHOD

CROSS-REFERENCE TO RELATED APPLICATION(S)

This application claims priority to the Chinese Patent Application No. 201510446339.9, filed on Jul. 27, 2015, entitled "STORAGE DEVICE AND INFORMATION PROCESSING METHOD", which is incorporated herein by reference in its entirety.

TECHNICAL FIELD

The present disclosure relates to an information processing technique, and in particular, to a storage device and an information processing method.

BACKGROUND

A semiconductor structure within particles of a solid state drive (SSD) flash memory is hypersensitive to temperature. An increase of temperature can intensify Brownian motion of electrons and can make electrons have a greater chance to escape from lattices, resulting in a voltage (number of electrons) within the lattices lower than a detectable (readable) normal range, and expressing as loss of data.

If an ordinary enterprise-level SSD stores at an ambient temperature of 25° C., or operates at an ambient temperature of 40° C., a data retention time period of the ordinary enterprise-level SSD is only 105 weeks (i.e. two years). If the temperature rises to 30° C., data retention time period is only one year. The data retention time is reduced by a half per 5° C. increment of the temperature. If the SSD is not energized for a long time, gates of transistors inside the flash memory are prone to lose their original properties, resulting in invalidation of the stored data.

SUMMARY

To solve the above technical problems, embodiments of the present disclosure provide a storage device and an information processing method.

A storage device provided by an embodiment of the present disclosure comprises a first power supply unit and at least one first storage cell. The at least one first storage cell stores first data which are associated with a number of charges within the first storage cell. The first power supply unit is electrically connected to the at least one first storage cell. The storage device further comprises:

a first control unit configured for controlling the first power supply unit to supply power to the at least one first storage cell according to a predetermined policy, so that the number of charges within the first storage cell satisfies a first preset condition.

An information processing method provided by an embodiment of the present disclosure may apply to a storage device. The storage device comprises a first power supply unit and at least one first storage cell. The at least one first storage cell stores first data which are associated with a number of charges within the first storage cell. The first power supply unit is electrically connected to the at least one first storage cell. The method comprises:

controlling the first power supply unit to supply power to the at least one first storage cell according to a predetermined policy, so that the number of charges within the first storage cell satisfies a first preset condition.

In the technical solutions of the embodiments of the present disclosure, the storage device has at least one first storage cell. Each of the first storage cells performs storage of the first data by means of saving electrons (charges) by a floating-gate transistor. The electrons may loss over time, which may result in data loss. Therefore, the storage device of the embodiments of the present disclosure further comprises a first power supply unit. The first power supply unit is electrically connected to the first storage cell. The first power supply unit may supply power to the first storage cells to ensure normal saving of the electrons, and thus prevent loss of data or abnormalities of the storage device. As such, it can prevent loss of data in the storage device, and thus can avoid startup abnormalities of an associated electronic device.

BRIEF DESCRIPTION OF THE DRAWINGS

FIG. 1 is an illustrative flowchart of an information processing method according to a first embodiment of the present disclosure;

FIG. 2 is an illustrative flowchart of an information processing method according to a second embodiment of the present disclosure;

DETAILED DESCRIPTION

In order to more thoroughly illustrate the features and solutions of the embodiments of the present disclosure, the embodiments of the present disclosure will be described in detail, with reference to the accompanying figures. It should be noted that the figures are for illustrative purposes only, and are not intended to limit the embodiments of the present disclosure.

FIG. 1 is an illustrative flowchart of an information processing method according to the first embodiment of the present disclosure. The information processing method of the present embodiment is applied to a storage device. The storage device comprises a first power supply unit and at least one first storage cell. The at least one first storage cell stores first data which are associated with a number of charges within the first storage cell. The first power supply unit is electrically connected to the at least one first storage cell.

As shown in FIG. 1, the information processing method comprises a step 101. In step 10 the first power supply unit is controlled to supply power to the at least one first storage cell according to a predetermined policy, so that the number of charges within the first storage cell satisfies a first preset condition.

In embodiments of the present disclosure, the storage device may be a solid-state drive (SSD). The SSD is a flash-memory-based data storage device, in which each data bit is stored in a flash memory cell made of a floating-gate transistor. In the floating-gate transistor, reading/writing and erasing of each bit is performed by using a voltage. That is, the floating-gate transistor performs storage of information bit by saving electrons.

In the above solution, the flash memory cell may be classified into a non-volatile (NOR) flash memory and a computer (NAND) flash memory. Erasing and writing operations of the NAND flash memory are based on a tunneling effect, in which the floating gate is charged (writing data) or discharged (erasing data) by charging the floating gate through a silicon substrate and thus causing a current to flow through an insulating layer between the floating gate and the silicon substrate. The data erasing operation of the NOR flash is also based on the tunneling effect, i.e., the current flowing from the floating gate to the silicon substrate; however, the data writing operation is performed by using hot electron injection, i.e., the current flowing from the floating gate to a source.

In the above solution, the first storage cell in the storage device specifically refers to the flash memory in the SSD. Hereinafter, the first storage cell of the embodiment of the present disclosure will be described in detail in connection with the structure of the flash memory shown in FIG. 5.

Figure 5:
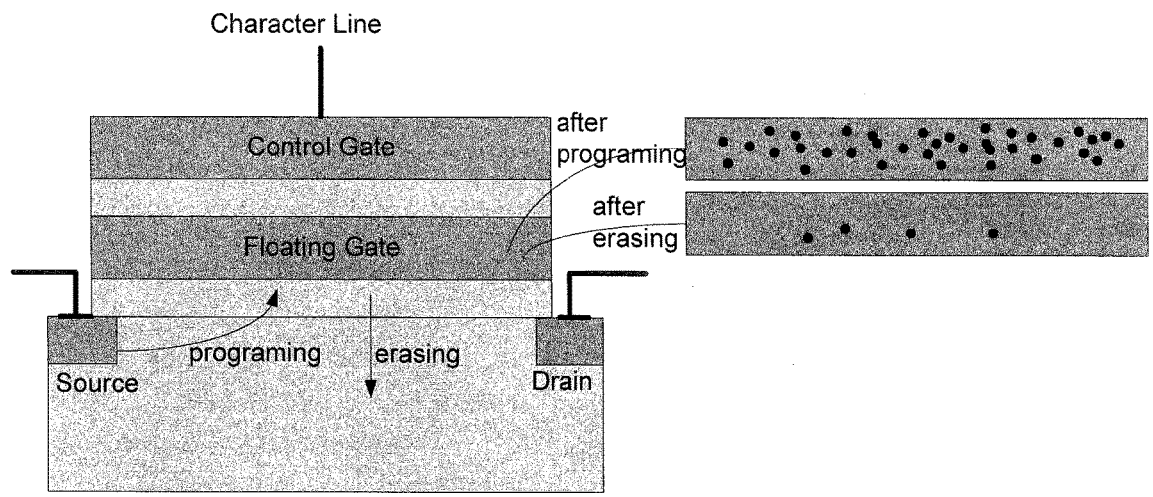
FIG. 5 is a schematic diagram of an internal structure of a flash memory according to an embodiment of the present disclosure.

Referring to FIG. 5, the flash memory is made of the floating-gate transistor. In particular, the internal storage structure of the flash memory is of a Metal-Oxide-Semiconductor Field-Effect Transistor (MOSFET). The flash memory consists of a source, a drain, a floating gate and a control gate, wherein the floating gate is the element for actually storing data.

The first data are stored as electrical charges at the floating gate of the flash memory. The number of the charges stored depends on the voltage applied at the control gate as shown in the figure. The control gate controls whether the floating gate is charged or discharged. The first data is represented by whether the voltage of the charges stored at the floating gate exceeds a specific threshold value (Vth).

The writing (programming) operation of the NAND flash memory is to charge the control gate (i.e. to apply a voltage to the control gate), so that the number of charges stored at the floating gate is larger enough to exceed the threshold value (Vth). In such a case, the first data stored in the flash memory represent 0.

The erasing operation of the NAND flash memory is to discharge the floating gate, so that the voltage at the floating gate is lower than the threshold (Vth). In such a case, the first data stored in the flash memory represent 1.

In the above-described embodiment, the first data being represented as 0 or 1 is not limited to the above-described manner. In an alternative manner, if the voltage of the floating gate exceeds the threshold (Vth), the first data stored in the flash memory represent 1; otherwise if the voltage of the floating gate is below the threshold (Vth), the first data stored in the flash memory represent 0.

In the embodiment of the present disclosure, the first power supply unit may be started by acquiring a first instruction. Specifically, the first instruction can be acquired by, but not limited to, the following ways.

In a first way, the first instruction is generated when a first predetermined time arrives. Specifically, the time for generating the first instruction may be set as the first predetermined time in advance. When the storage device detects that the first predetermined time arrives, the first instruction is automatically generated.

In a second way, the first instruction is generated when a first operation of the user is detected. The first operation is an operation to start the first power supply unit. Specifically, the first instruction is acquired based on the first operation of the user.

In the above-described embodiment, the first instruction is used to start the power supply unit.

In the embodiment of the present disclosure, the solid-state drive performs the storage of the first data by means of saving electrons by the floating-gate transistor. The electrons may loss over time, which may result in data loss. Once loss of important data occurs, it may cause startup abnormality of the computer. Thus, the storage device (SSD) further has the first power supply unit. In particular, a battery is added on the SSD, which powers on the flash memory on the SSD at irregular intervals, so as to ensure normal saving of the electrons in the flash memory, and thus prevent loss of data or startup abnormality of the hard drive.

In the embodiment of the present disclosure, after the first power supply unit is started, the first power supply unit supplies power to each of the first storage cells of the storage device. Referring to FIG. 5, the charges at the floating gate of the flash memory are kept within a certain range by means of powering the flash memory by a battery.

In the embodiment of the present disclosure, a charging policy may be set as below: taking a timing for writing the first data as a starting point in time; and automatically controlling the first power supply unit to supply power to the at least one first storage cell, after a predetermined time period elapses from the starting point. Alternatively, taking the last charging timing a starting point in time, the first power supply unit is automatically controlled to supply power to the at least one first storage cell, after a predetermined time period elapses from the starting point. That Is, it is possible to periodically control the first power supply unit to supply power to the at least one first storage cell in accordance with the predetermined time period.

In the embodiment of the present disclosure, the first data are stored as charges at the floating gate of the flash memory. When the first power supply unit is supplying power to the first storage cell, the charges at the floating gate is in a first motion state. In particular, when the charges at the floating gate is in the first motion state, a variation of the voltage corresponding to charges at the floating gate over time is no more than some threshold, so that the voltage corresponding to charges at the floating gate always exceeds the threshold (Vth). Supplying power to the first storage cell by the first power supply unit ensures normal saving of the electrons, and thus prevents loss of data or abnormalities of the storage device.

FIG. 2 is an illustrative flowchart of an information processing method according to the second embodiment of the present disclosure. The information processing method of the present embodiment is applied to a storage device. The storage device comprises a first power supply unit and at least one first storage cell. The at least one first storage cell stores first data which are associated with a number of charges within the first storage cell. The first power supply unit is electrically connected to the at least one first storage cell.

As shown in FIG. 2, the information processing method comprises a step 201. In step 201, it is determined whether a voltage corresponding to charges in the first storage cell is lower than a first threshold.

In embodiments of the present disclosure, the storage device may be a solid-state drive (SSD). The SSD is a flash-memory-based data storage device, in which each data bit is stored in a flash memory cell made of a floating-gate transistor. In the floating-gate transistor, reading/writing and erasing of each bit is performed by using a voltage. That is, the floating-gate transistor performs storage of information bit by saving electrons.

In the above solution, the flash memory cell may be classified into a non-volatile (NOR) flash memory and a computer (NAND) flash memory. Erasing and writing operations of the NAND flash memory are based on a tunneling effect, in which the floating gate is charged (writing data) or discharged (erasing data) by charging the floating gate through a silicon substrate and thus causing a current to flow through an insulating layer between the floating gate and the silicon substrate. The data erasing operation of the NOR flash is also based on the tunneling effect, i.e., the current flowing from the floating gate to the silicon substrate; however, the data writing operation is performed by using hot electron injection, i.e., the current flowing from the floating gate to a source.

In the above solution, the first storage cell in the storage device specifically refers to the flash memory in the SSD. Hereinafter, the first storage cell of the embodiment of the present disclosure will be described in detail in connection with the structure of the flash memory shown in FIG. 5.

Referring to FIG. 5, the flash memory is made of the floating-gate transistor. In particular, the internal storage structure of the flash memory is of a Metal-Oxide-Semiconductor Field-Effect Transistor (MOSFET). The flash memory consists of a source, a drain, a floating gate and a control gate, wherein the floating gate is the element for actually storing data.

The first data are stored as electrical charges at the floating gate of the flash memory. The number of the charges stored depends on the voltage applied at the control gate as shown in the figure. The control gate controls whether the floating gate is charged or discharged. The first data is represented by whether the voltage of the charges stored at the floating gate exceeds a specific threshold value (Vth).

The writing (programming) operation of the NAND flash memory is to charge the control gate (i.e. to apply a voltage to the control gate), so that the number of charges stored at the floating gate is larger enough to exceed the threshold value (Vth). In such a case, the first data stored in the flash memory represent 0.

The erasing operation of the NAND flash memory is to discharge the floating gate, so that the voltage at the floating gate is lower than the threshold (Vth). In such a case, the first data stored in the flash memory represent 1.

In the above-described embodiment, the first data being represented as 0 or 1 is not limited to the above-described manner. In an alternative manner, if the voltage of the floating gate exceeds the threshold (Vth), the first data stored in the flash memory represent 1; otherwise if the voltage of the floating gate is below the threshold (Vth), the first data stored in the flash memory represent 0.

In the embodiment of the present disclosure, the first power supply unit may be started by acquiring a first instruction. Specifically, the first instruction can be acquired by, but not limited to, the following ways.

In a first way, the first instruction is generated when a first predetermined time arrives. Specifically, the time for generating the first instruction may be set as the first predetermined time in advance. When the storage device detects that the first predetermined time arrives, the first instruction is automatically generated.

In a second way, the first instruction is generated when a first operation of the user is detected. The first operation is an operation to start the first power supply unit. Specifically, the first instruction is acquired based on the first operation of the user.

In the above-described embodiment, the first instruction is used to start the power supply unit.

In the embodiment of the present disclosure, the first threshold is a threshold (Vth) corresponding to the voltage at the floating gate. When the voltage corresponding to the charges in the first storage cell is lower than the first threshold, it indicates that data will be lost. At this time, the first storage cell should be charged.

In step 202, when the voltage corresponding to the charges in the first storage cell is lower than the first threshold, the first power supply unit is controlled to supply power to the first storage cell, so that the voltage corresponding to the charges representing the first data is higher than the first threshold.

In the embodiment of the present disclosure, the solid-state drive performs the storage of the first data by means of saving electrons by the floating-gate transistor. The electrons may loss over time, which may result in data loss. Once loss of important data occurs, it may cause startup abnormality of the computer. Thus, the storage device (SSD) further has the first power supply unit. In particular, a battery is added on the SSD, which powers on the flash memory on the SSD at irregular intervals, so as to ensure normal saving of the electrons in the flash memory, and thus prevent loss of data or startup abnormality of the hard drive.

In the embodiment of the present disclosure, after the first power supply unit is started, the first power supply unit supplies power to each of the first storage cells of the storage device. Referring to FIG. 5, the charges at the floating gate of the flash memory are kept within a certain range by means of powering the flash memory by a battery.

In the embodiment of the present disclosure, the first data are stored as charges at the floating gate of the flash memory. When the first power supply unit is supplying power to the first storage cell, the charges at the floating gate is in a first motion state. In particular, when the charges at the floating gate is in the first motion state, the variation over time of the voltage corresponding to charges at the floating gate is more than some threshold, so that the voltage corresponding to the charges at the floating gate always exceeds the threshold (Vth). Supplying power to the first storage cell by the first power supply unit ensures normal saving of electrons, and thus prevents loss of data or abnormalities of the storage device.

Figure 3:
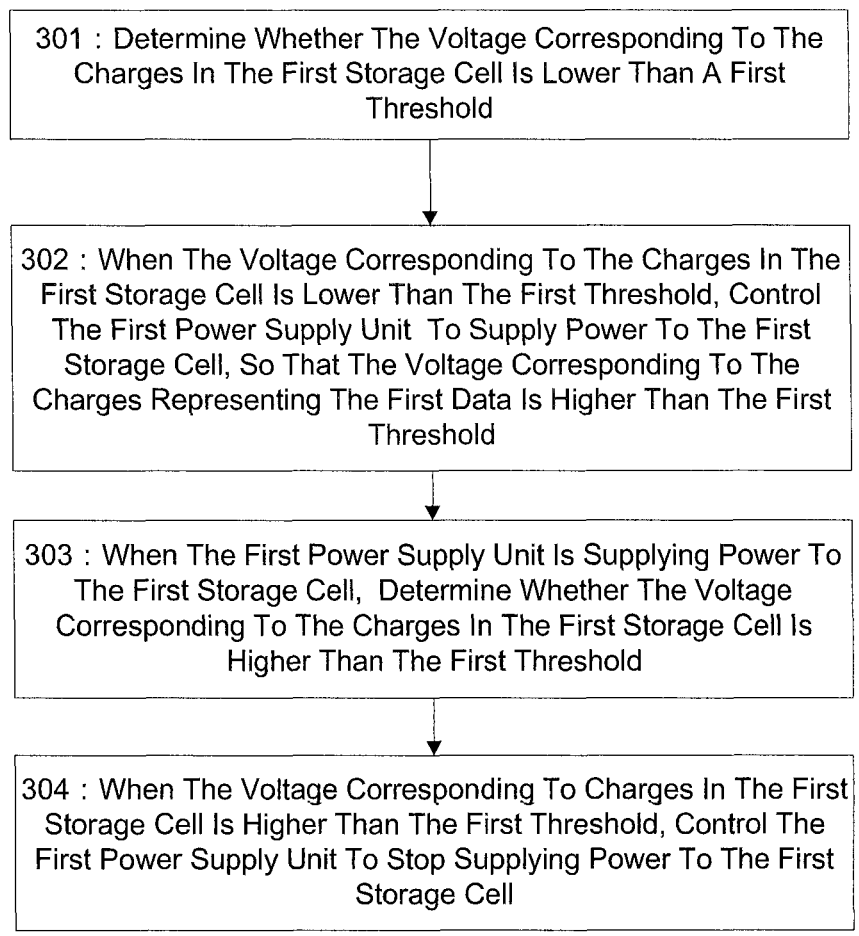
FIG. 3 is an illustrative flowchart of an information processing method according to a third embodiment of the present disclosure.

FIG. 3 is an illustrative flowchart of an information processing method according to the third embodiment of the present disclosure. The information processing method of the present embodiment is applied to a storage device. The storage device comprises a first power supply unit and at least one first storage cell. The at least one first storage cell stores first data which are associated with the number of charges within the first storage cell. The first power supply unit is electrically connected to the at least one first storage cell.

As shown in FIG. 3, the information processing method comprises a step 301. In step 301, it is determined whether a voltage corresponding to charges in the first storage cell is lower than a first threshold.

In embodiments of the present disclosure, the storage device may be a solid-state drive (SSD). The SSD is a flash-memory-based data storage device, in which each data bit is stored in a flash memory cell made of a floating-gate transistor. In the floating-gate transistor, reading/writing and erasing of each bit is performed by using a voltage. That is, the floating-gate transistor performs storage of information bit by saving electrons.

In the above solution, the flash memory cell may be classified into a non-volatile (NOR) flash memory and a computer (NAND) flash memory. Erasing and writing operations of the NAND flash memory are based on a tunneling effect, in which the floating gate is charged (writing data) or discharged (erasing data) by charging the floating gate through a silicon substrate and thus causing a current to flow through an insulating layer between the floating gate and the silicon substrate. The data erasing operation of the NOR flash is also based on the tunneling effect, i.e., the current flowing from the floating gate to the silicon substrate; however, the data writing operation is performed by using hot electron injection, i.e., the current flowing from the floating gate to a source.

In the above solution, the first storage cell in the storage device specifically refers to the flash memory in the SSD. Hereinafter, the first storage cell of the embodiment of the present disclosure will be described in detail in connection with the structure of the flash memory shown in FIG. 5.

Referring to FIG. 5, the flash memory is made of the floating-gate transistor. In particular, the internal storage structure of the flash memory is of a Metal-Oxide-Semiconductor Field-Effect Transistor (MOSFET). The flash memory consists of a source, a drain, a floating gate and a control gate, wherein the floating gate is the element for actually storing data.

The first data are stored as electrical charges at the floating gate of the flash memory. The number of the charges stored depends on the voltage applied at the control gate as shown in the figure. The control gate controls whether the floating gate is charged or discharged. The first data is represented by whether the voltage of the charges stored at the floating gate exceeds a specific threshold value (Vth).

The writing (programming) operation of the NAND flash memory is to charge the control gate (i.e. to apply a voltage to the control gate), so that the number of charges stored at the floating gate is larger enough to exceed the threshold value (Vth). In such a case, the first data stored in the flash memory represent 0.

The erasing operation of the NAND flash memory is to discharge the floating gate, so that the voltage at the floating gate is lower than the threshold (Vth). In such a case, the first data stored in the flash memory represent 1.

In the above-described embodiment, the first data being represented as 0 or 1 is not limited to the above-described manner. In an alternative manner, if the voltage of the floating gate exceeds the threshold (Vth), the first data stored in the flash memory represent 1; otherwise if the voltage of the floating gate is below the threshold (Vth), the first data stored in the flash memory represent 0.

In the embodiment of the present disclosure, the first power supply unit may be started by acquiring a first instruction. Specifically, the first instruction can be acquired by, but not limited to, the following ways.

In a first way, the first instruction is generated when a first predetermined time arrives. Specifically, the time for generating the first instruction may be set as the first predetermined time in advance. When the storage device detects that the first predetermined time arrives, the first instruction is automatically generated.

In a second way, the first instruction is generated when a first operation of the user is detected. The first operation is an operation to start the first power supply unit. Specifically, the first instruction is acquired based on the first operation of the user.

In the above-described embodiment, the first instruction is used to start the power supply unit.

In the embodiment of the present disclosure, the first threshold is a threshold (Vth) corresponding to the voltage at the floating gate. When the voltage corresponding to the charges in the first storage cell is lower than the first threshold, it indicates that data will be lost. At this time, the first storage cell should be charged.

In step 302, when the voltage corresponding to the charges in the first storage cell is lower than the first threshold, the first power supply unit is controlled to supply power to the first storage cell, so that the voltage corresponding to the charges representing the first data is higher than the first threshold.

In the embodiment of the present disclosure, the solid-state drive performs the storage of the first data by means of saving electrons by the floating-gate transistor. The electrons may loss over time, which may result in data loss. Once loss of important data occurs, it may cause startup abnormality of the computer. Thus, the storage device (SSD) further has the first power supply unit. In particular, a battery is added on the SSD, which powers on the flash memory on the SSD at irregular intervals, so as to ensure normal saving of the electrons in the flash memory, and thus prevent loss of data or startup abnormality of the hard drive.

In the embodiment of the present disclosure, after the first power supply unit is started, the first power supply unit supplies power to each of the first storage cells of the storage device. Referring to FIG. 5, the charges at the floating gate of the flash memory are kept within a certain range by means of powering the flash memory by a battery.

In step 303, when the first power supply unit is supplying power to the first storage cell, it is determined whether the voltage corresponding to the charges in the first storage cell is higher than the first threshold.

In the embodiment of the present disclosure, once the voltage corresponding to the charges in the first storage cell is higher than the first threshold, it indicates that the first data in the first storage cell will not be lost. At this time, the power supply to the first storage cell may be stopped, which saves power.

In step 304, when the voltage corresponding to the charges in the first storage cell is higher than the first threshold, the first power supply unit is controlled to stop supplying power to the first storage cell.

In the embodiment of the present disclosure, the first data are stored as charges at the floating gate of the flash memory. When the first power supply unit is supplying power to the first storage cell, the charges at the floating gate is in a first motion state. In particular, when the charges at the floating gate is in the first motion state, the variation over time of the voltage corresponding to charges at the floating gate is more than some threshold, so that the voltage corresponding to the charges at the floating gate always exceeds the threshold (Vth). Supplying power to the first storage cell by the first power supply unit ensures normal saving of electrons, and thus prevents loss of data or abnormalities of the storage device.

Figure 4:
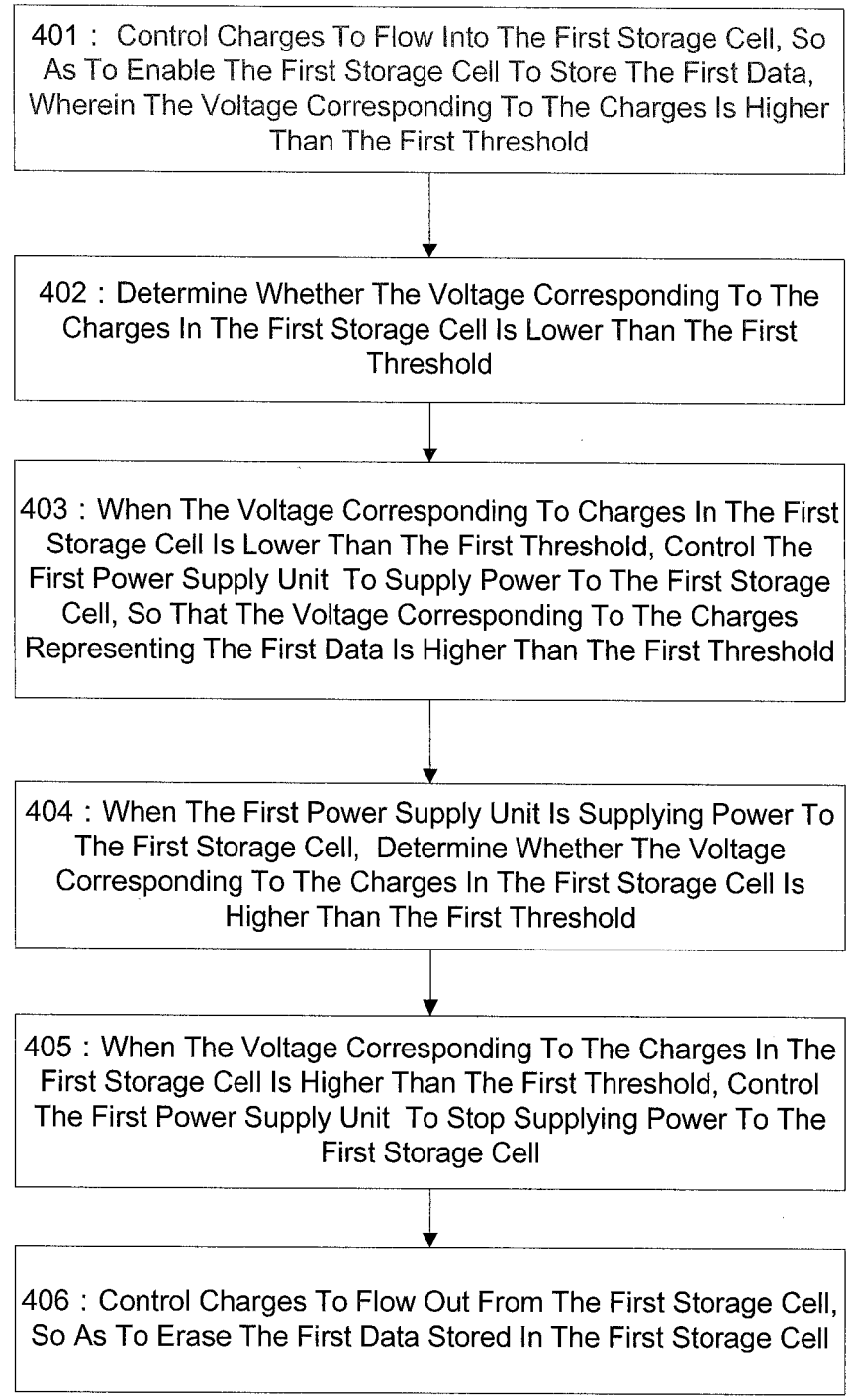
FIG. 4 is an illustrative flowchart of an information processing method according to a fourth embodiment of the present disclosure.

FIG. 4 is an illustrative flowchart of an information processing method according to the fourth embodiment of the present disclosure. The information processing method of the present embodiment is applied to a storage device. The storage device comprises a first power supply unit and at least one first storage cell. The at least one first storage cell stores first data which are associated with the number of charges within the first storage cell. The first power supply unit is electrically connected to the at least one first storage cell.

As shown in FIG. 4, the information processing method comprises a step 401. In step 401, charges are controlled to flow into the first storage cell, so as to enable the first storage cell to store the first data, wherein the voltage corresponding to the charges is higher than the first threshold.

In embodiments of the present disclosure, the storage device may be a solid-state drive (SSD). The SSD is a flash-memory-based data storage device, in which each data bit is stored in a flash memory cell made of a floating-gate transistor. In the floating-gate transistor, reading/writing and erasing of each bit is performed by using a voltage. That is, the floating-gate transistor performs storage of information bit by saving electrons.

In the above solution, the flash memory cell may be classified into a non-volatile (NOR) flash memory and a computer (NAND) flash memory. Erasing and writing operations of the NAND flash memory are based on a tunneling effect, in which the floating gate is charged (writing data) or discharged (erasing data) by charging the floating gate through a silicon substrate and thus causing a current to flow through an insulating layer between the floating gate and the silicon substrate. The data erasing operation of the NOR flash is also based on the tunneling effect, i.e., the current flowing from the floating gate to the silicon substrate; however, the data writing operation is performed by using hot electron injection, i.e., the current flowing from the floating gate to a source.

In the above solution, the first storage cell in the storage device specifically refers to the flash memory in the SSD. Hereinafter, the first storage cell of the embodiment of the present disclosure will be described in detail in connection with the structure of the flash memory shown in FIG. 5.

Referring to FIG. 5, the flash memory is made of the floating-gate transistor. In particular, the internal storage structure of the flash memory is of a Metal-Oxide-Semiconductor Field-Effect Transistor (MOSFET). The flash memory consists of a source, a drain, a floating gate and a control gate, wherein the floating gate is the element for actually storing data.

The first data are stored as electrical charges at the floating gate of the flash memory. The number of the charges stored depends on the voltage applied at the control gate as shown in the figure. The control gate controls whether the floating gate is charged or discharged. The first data is represented by whether the voltage of the charges stored at the floating gate exceeds a specific threshold value (Vth).

The writing (programming) operation of the NAND flash memory is to charge the control gate (i.e. to apply a voltage to the control gate), so that the number of charges stored at the floating gate is larger enough to exceed the threshold value (Vth). In such a case, the first data stored in the flash memory represent 0.

The erasing operation of the NAND flash memory is to discharge the floating gate, so that the voltage at the floating gate is lower than the threshold (Vth). In such a case, the first data stored in the flash memory represent 1.

In the above-described embodiment, the first data being represented as 0 or 1 is not limited to the above-described manner. In an alternative manner, if the voltage of the floating gate exceeds the threshold (Vth), the first data stored in the flash memory represent 1; otherwise if the voltage of the floating gate is below the threshold (Vth), the first data stored in the flash memory represent 0.

In step 402, it is determined whether the voltage corresponding to charges in the first storage cell is lower than a first threshold.

In the embodiment of the present disclosure, the first power supply unit may be started by acquiring a first instruction. Specifically, the first instruction can be acquired by, but not limited to, the following ways.

In a first way, the first instruction is generated when a first predetermined time arrives. Specifically, the time for generating the first instruction may be set as the first predetermined time in advance. When the storage device detects that the first predetermined time arrives, the first instruction is automatically generated.

In a second way, the first instruction is generated when a first operation of the user is detected. The first operation is an operation to start the first power supply unit. Specifically, the first instruction is acquired based on the first operation of the user.

In the above-described embodiment, the first instruction is used to start the power supply unit.

In the embodiment of the present disclosure, the first threshold is a threshold (Vth) corresponding to the voltage at the floating gate. When the voltage corresponding to the charges in the first storage cell is lower than the first threshold, it indicates that data will be lost. At this time, the first storage cell should be charged.

In step 403, when the voltage corresponding to the charges in the first storage cell is lower than the first threshold, the first power supply unit is controlled to supply power to the first storage cell, so that the voltage corresponding to the charges representing the first data is higher than the first threshold.

In the embodiment of the present disclosure, the solid-state drive performs the storage of the first data by means of saving electrons by the floating-gate transistor. The electrons may loss over time, which may result in data loss. Once loss of important data occurs, it may cause startup abnormality of the computer. Thus, the storage device (SSD) further has the first power supply unit. In particular, a battery is added on the SSD, which powers on the flash memory on the SSD at irregular intervals, so as to ensure normal saving of the electrons in the flash memory, and thus prevent loss of data or startup abnormality of the hard drive.

In the embodiment of the present disclosure, after the first power supply unit is started, the first power supply unit supplies power to each of the first storage cells of the storage device. Referring to FIG. 5, the charges at the floating gate of the flash memory are kept within a certain range by means of powering the flash memory by a battery.

In step 404, when the first power supply unit is supplying power to the first storage cell, it is determined whether the voltage corresponding to the charges in the first storage cell is higher than the first threshold.

In the embodiment of the present disclosure, once the voltage corresponding to the charges in the first storage cell is higher than the first threshold, it indicates that the first data in the first storage cell will not be lost. At this time, the power supply to the first storage cell may be stopped, which saves power.

In step 405, when the voltage corresponding to the charges in the first storage cell is higher than the first threshold, the first power supply unit is controlled to stop supplying power to the first storage cell.

In step 406, charges are controlled to flow out from the first storage cell, so as to erase the first data stored in the first storage cell.

In the embodiment of the present disclosure, the first data are stored as charges at the floating gate of the flash memory. When the first power supply unit is supplying power to the first storage cell, the charges at the floating gate is in a first motion state. In particular, when the charges at the floating gate is in the first motion state, the variation over time of the voltage corresponding to charges at the floating gate is more than some threshold, so that the voltage corresponding to the charges at the floating gate always exceeds the threshold (Vth). Supplying power to the first storage cell by the first power supply unit ensures normal saving of electrons, and thus prevents loss of data or abnormalities of the storage device.

Figure 6:
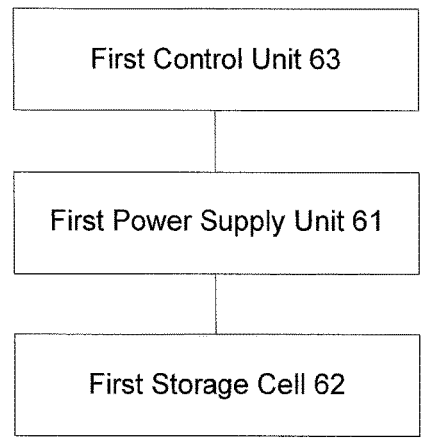
FIG. 6 is a block schematic diagram of a storage device according to the first embodiment of the present disclosure.

FIG. 6 is a block schematic diagram of a storage device according to the first embodiment of the present disclosure. As shown in FIG. 6, the storage device comprises a first power supply unit 61 and at least one first storage cell 62. The at least one first storage cell 62 stores first data, which are associated with a number of charges within the first storage cell. The first power supply unit 61 is electrically connected to the at least one first storage cell 62. The storage device further comprises a first control unit 63.

The first control unit 63 is configured for controlling the first power supply unit to supply power to the at least one first storage cell according to a predetermined policy, so that the number of charges within the first storage cell satisfies a first preset condition.

The first control unit 63 is further configured for controlling the first power supply unit to supply power to the at least one first storage cell, when a predetermined time period elapses.

Those skilled in the art should appreciate that, the implementations and functions of respective elements of the storage device mentioned above can be understood with reference to the above related description of the information processing method.

Figure 7:
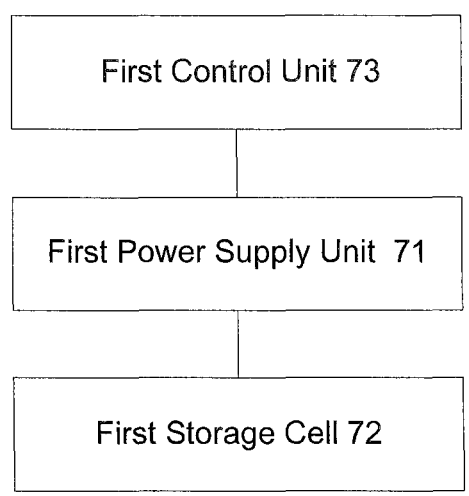
FIG. 7 is a block schematic diagram of a storage device according to the second embodiment of the present disclosure.

FIG. 7 is a block schematic diagram of a storage device according to the second embodiment of the present disclosure. As shown in FIG. 7, the storage device comprises a first power supply unit 71 and at least one first storage cell 72. The at least one first storage cell 72 stores first data, which are associated with a number of charges within the first storage cell. The first power supply unit 71 is electrically connected to the at least one first storage cell 72. The storage device further comprises a first control unit 73.

The first control unit 73 is configured for controlling the first power supply unit to supply power to the at least one first storage cell according to a predetermined policy, so that the number of charges within the first storage cell satisfies a first preset condition.

The first control unit 73 is further configured for determining whether the voltage corresponding to charges in the first storage cell is lower than a first threshold; and for controlling the first power supply unit to supply power to the first storage cell, so that the voltage corresponding to the charges representing the first data is higher than the first threshold, when the voltage corresponding to the charges in the first storage cell is lower than the first threshold.

Those skilled in the art should appreciate that, the implementations and functions of respective elements of the storage device mentioned above can be understood with reference to the above related description of the information processing method.

Figure 8:
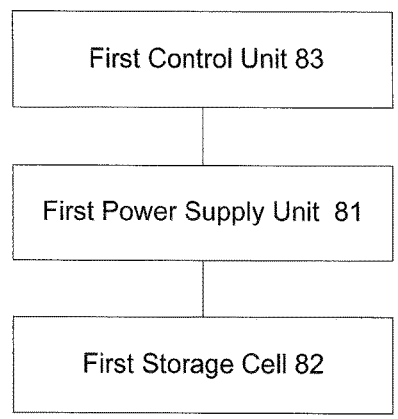
FIG. 8 is a block schematic diagram of a storage device according to the third embodiment of the present disclosure.

FIG. 8 is a block schematic diagram of a storage device according to the third embodiment of the present disclosure. As shown in FIG. 8, the storage device comprises a first power supply unit 81 and at least one first storage cell 82. The at least one first storage cell 82 stores first data, which are associated with a number of charges within the first storage cell. The first power supply unit 81 is electrically connected to the at least one first storage cell 82. The storage device further comprises a first control unit 83.

The first control unit 83 is configured for controlling the first power supply unit to supply power to the at least one first storage cell according to a predetermined policy, so that the number of charges within the first storage cell satisfies a first preset condition.

The first control unit 83 is further configured for determining whether the voltage corresponding to charges in the first storage cell is lower than a first threshold; and for controlling the first power supply unit to supply power to the first storage cell, so that the voltage corresponding to the charges representing the first data is higher than the first threshold, when the voltage corresponding to the charges in the first storage cell is lower than the first threshold.

The first control unit 83 is further configured for determining whether the voltage corresponding to the charges in the first storage cell is higher than the first threshold, when the first power supply unit is supplying power to the first storage cell; and for controlling the first power supply unit to stop supplying power to the first storage cell, when the voltage corresponding to the charges in the first storage cell is higher than the first threshold.

Those skilled in the art should appreciate that, the implementations and functions of respective elements of the storage device mentioned above can be understood with reference to the above related description of the information processing method.

Figure 9:
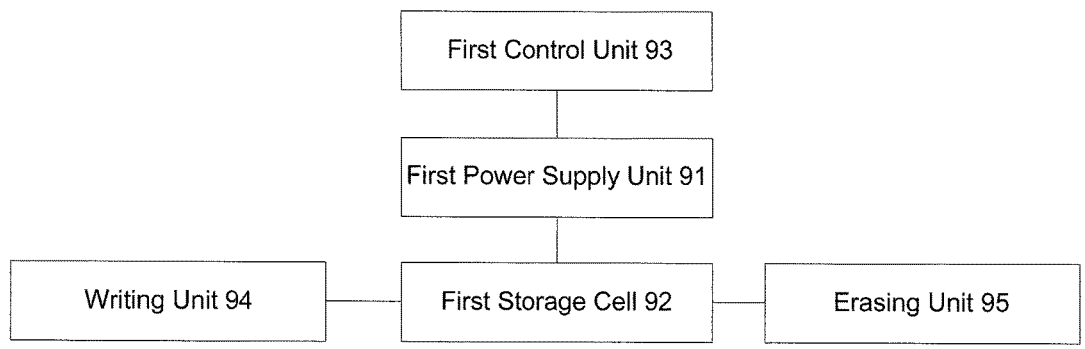
FIG. 9 is a block schematic diagram of a storage device according to the fourth embodiment of the present disclosure.

FIG. 9 is a block schematic diagram of a storage device according to the fourth embodiment of the present disclosure. As shown in FIG. 9, the storage device comprises a first power supply unit 91 and at least one first storage cell 92. The at least one first storage cell 92 stores first data, which are associated with a number of charges within the first storage cell. The first power supply unit 91 is electrically connected to the at least one first storage cell 92. The storage device further comprises a first control unit 93.

The first control unit 93 is configured for controlling the first power supply unit to supply power to the at least one first storage cell according to a predetermined policy, so that the number of charges within the first storage cell satisfies a first preset condition.

The first control unit 93 is further configured for determining whether the voltage corresponding to charges in the first storage cell is lower than a first threshold; and for controlling the first power supply unit to supply power to the first storage cell, so that the voltage corresponding to the charges representing the first data is higher than the first threshold, when the voltage corresponding to the charges in the first storage cell is lower than the first threshold.

The first control unit 93 is further configured for determining whether the voltage corresponding to the charges in the first storage cell is higher than the first threshold when the first power supply unit is supplying power to the first storage cell; and for controlling the first power supply unit to stop supplying power to the first storage cell when the voltage corresponding to the charges in the first storage cell is higher than the first threshold.

The storage device further comprises a writing unit 94 configured for controlling charges to flow into the first storage cell, so as to enable the first storage cell to store the first data, wherein the voltage corresponding to the charges is higher than the first threshold.

The storage device further comprises an erasing unit 95 configured for controlling charges to flow out from the first storage cell, so as to erase the first data stored in the first storage cell.

Those skilled in the art should appreciate that, the implementations and functions of respective elements of the storage device mentioned above can be understood with reference to the above related description of the information processing method.

Any combination of the embodiments recited in the present disclosure may be implemented in case there is no confliction.

It can be appreciated from the embodiments of the present application that the disclosed method and smart device can be implemented in alternative ways. The device embodiments as described above are illustrative only. For example, while the units have been divided in accordance with their logical functions, other divisions are possible in practice. For example, more than one unit or element can be combined or can be integrated into another system, or some features can be ignored or omitted. In addition, the coupling, direct coupling or communicative connection between various components as shown or discussed can be an indirect coupling or communicative connection via some interface, device or unit and can be electrical, mechanical or in another form.

The units described above as separated may or may not be physically separated. The components shown as units may or may not be physical units. They can be co-located or can be distributed over a number of network elements. Depending on actual requirements, some or all of the units can be selected to achieve the object of the present disclosure.

Further, all the functional units in various embodiments of the present disclosure can be integrated within one processing unit, or each of these units can be a separate unit, or two or more units can be integrated into one unit. Such integrated unit can be implemented in hardware, possibly in combination with software functional units.

As illustrated above, it will be appreciated that specific embodiments of the disclosure have been described herein for purposes of illustration, but the scope of the present disclosure is not limited thereto. Various modifications and alternatives can be made by those skilled in the art without departing from the scope of the present disclosure. These modifications and alternatives are to be encompassed by the scope of the present disclosure.

We claim:

1. A storage device, comprising:
    a first power supply unit and at least one first storage cell, wherein the at least one first storage cell stores first data which are associated with a number of charges within the first storage cell, wherein the first power supply unit is electrically connected to the at least one first storage cell, and
    a first control unit configured for controlling the first power supply unit to supply power to the at least one first storage cell according to a predetermined policy, so that the number of charges within the first storage cell satisfies a first preset condition,
    wherein the first control unit is further configured:
    for determining whether a voltage corresponding to the charges in the first storage cell is lower than a first threshold; and
    for controlling the first power supply unit to supply power to the first storage cell so that the voltage corresponding to the charges representing the first data is higher than the first threshold, when the voltage corresponding to the charges in the first storage cell is lower than the first threshold.

2. The storage device according to claim 1, wherein the first control unit is further configured:
    for determining whether the voltage corresponding to the charges in the first storage cell is higher than the first threshold, when the first power supply unit is supplying power to the first storage cell; and
    for controlling the first power supply unit to stop supplying power to the first storage cell, when the voltage corresponding to the charges in the first storage cell is higher than the first threshold.

3. The storage device according to claim 1, wherein the first control unit is further configured for controlling the first power supply unit to supply power to the at least one first storage cell, when a predetermined time period elapses.

4. The storage device according to claim 1, further comprising:
    a writing unit, configured for controlling charges to flow into the first storage cell, so as to enable the first storage cell to store the first data, wherein the voltage corresponding to the charges is higher than the first threshold.

5. The storage device according to claim 4, further comprising:
    an erasing unit, configured for controlling charges to flow out from the first storage cell, so as to erase the first data stored in the first storage cell.

6. An information processing method applied to a storage device, the storage device comprising a first power supply unit and at least one first storage cell, the at least one first storage cell storing first data which are associated with a number of charges within the first storage cell, the first power supply unit being electrically connected to the at least one first storage cell, said method comprising:
    controlling the first power supply unit to supply power to the at least one first storage cell according to a predetermined policy, so that the number of charges within the first storage cell satisfies a first preset condition,
    wherein the controlling the first power supply unit to supply power to the at least one first storage cell according to the predetermined policy so that the number of charges within the first storage cell satisfies the first preset condition comprises:
    determining whether a voltage corresponding to the charges in the first storage cell is lower than a first threshold; and
    controlling the first power supply unit to supply power to the first storage cell so that the voltage corresponding to the charges representing the first data is higher than the first threshold, when the voltage corresponding to the charges in the first storage cell is lower than the first threshold.

7. The method according to claim 6, wherein the method further comprises:
    determining whether the voltage corresponding to the charges in the first storage cell is higher than the first threshold, when the first power supply unit is supplying power to the first storage cell; and controlling the first power supply unit to stop supplying power to the first storage cell, when the voltage corresponding to the charges in the first storage cell is higher than the first threshold.

8. The method according to claim 6, wherein controlling the first power supply unit to supply power to the at least one first storage cell according to the predetermined policy comprises:

controlling the first power supply unit to supply power to the at least one first storage cell when a predetermined time period elapses.

9. The method according to claim 6, further comprising:
controlling charges to flow into the first storage cell, so as to enable the first storage cell store the first data, wherein the voltage corresponding to the charges is higher than the first threshold.

10. The method according to claim 9, further comprising:
controlling charges to flow out from the first storage cell, so as to erase the first data stored in the first storage cell.

* * * * *